(12) United States Patent
Tanaka et al.

(10) Patent No.: US 12,050,236 B2
(45) Date of Patent: *Jul. 30, 2024

(54) CURRENT SENSOR

(71) Applicant: Asahi Kasei Microdevices Corporation, Tokyo (JP)

(72) Inventors: Ken Tanaka, Tokyo (JP); Masaki Tsujimoto, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/451,846

(22) Filed: Aug. 18, 2023

(65) Prior Publication Data

US 2024/0110949 A1 Apr. 4, 2024

(30) Foreign Application Priority Data

Oct. 4, 2022 (JP) .................................. 2022-160158

(51) Int. Cl.
*G01R 15/20* (2006.01)
*G01R 19/00* (2006.01)

(52) U.S. Cl.
CPC ......... *G01R 15/20* (2013.01); *G01R 19/0092* (2013.01)

(58) Field of Classification Search
CPC ............................ G01R 15/20; G01R 19/0092
See application file for complete search history.

(56) References Cited

U.S. PATENT DOCUMENTS 10,101,368 B2 * 10/2018 Koiwa ................. G01R 15/207
10,215,781 B2 * 2/2019 Suzuki ............... G01R 19/0092
(Continued)

FOREIGN PATENT DOCUMENTS

JP 2013245942 A 12/2013
JP 2015045634 A 3/2015
(Continued)

OTHER PUBLICATIONS

Decision to Grant a Patent issued for counterpart Japanese Application No. 2022-160158, transmitted from the Japanese Patent Office on Jun. 6, 2023 (drafted on May 26, 2023).

(Continued)

*Primary Examiner* — Dominic E Hawkins

(57) ABSTRACT

A current sensor includes at least one magnetoelectric conversion element, a conductor that at least partially surrounds the at least one magnetoelectric conversion element in a plan view and through which a measurement current to be measured with the at least one magnetoelectric conversion element flows, an element supporting portion comprised of a semiconductor substrate, and supports the at least one magnetoelectric conversion element and the conductor on a first surface, a signal processing IC that processes a signal that is output from the at least one magnetoelectric conversion element, an encapsulating portion that encapsulates the at least one magnetoelectric conversion element, the conductor, and the signal processing IC, and a pair of first lead terminals that is partially exposed on a side surface of the encapsulating portion and is electrically connected to the conductor, inputs the measurement current to the conductor and outputs the measurement current from the conductor.

5 Claims, 8 Drawing Sheets

(56) References Cited

U.S. PATENT DOCUMENTS

| | | | |
|---|---|---|---|
| 11,644,485 B2* | 5/2023 | Liu | G01R 19/0092 |
| | | | 324/762.02 |
| 11,768,230 B1* | 9/2023 | Liu | G01R 15/207 |
| | | | 324/126 |
| 2005/0045359 A1 | 3/2005 | Doogue | |
| 2008/0297138 A1 | 12/2008 | Taylor | |
| 2011/0248711 A1 | 10/2011 | Ausserlechner | |
| 2013/0187644 A1 | 7/2013 | Tay | |
| 2014/0167736 A1 | 6/2014 | Suzuki | |
| 2016/0187388 A1 | 6/2016 | Suzuki | |
| 2017/0160313 A1* | 6/2017 | Koiwa | G01R 15/202 |
| 2017/0222131 A1 | 8/2017 | Chew | |
| 2019/0391185 A1 | 12/2019 | El Bacha | |

FOREIGN PATENT DOCUMENTS

| | | | |
|---|---|---|---|
| JP | 2016065882 A | 4/2016 | |
| JP | 6017182 B2 | 10/2016 | |
| JP | 2018165699 A | 10/2018 | |

OTHER PUBLICATIONS

Office Action issued for related Japanese Application No. 2022-160194, transmitted from the Japanese Patent Office on Feb. 21, 2023 (drafted on Feb. 16, 2023).

* cited by examiner

CURRENT SENSOR

The contents of the following patent application(s) are incorporated herein by reference: NO. 2022-160158 filed in JP on Oct. 4, 2022

BACKGROUND

1. Technical Field

The present invention relates to a current sensor.

2. Related Art

Patent Document 1 and Patent Document 2 disclose a current sensor having a magnetoelectric conversion element.

PRIOR ART DOCUMENT

Patent Document

Patent Document 1: Japanese Patent No. 6415148
Patent Document 2: Japanese Patent No. 6017182

DESCRIPTION OF EXEMPLARY EMBODIMENTS

Figure 1A:
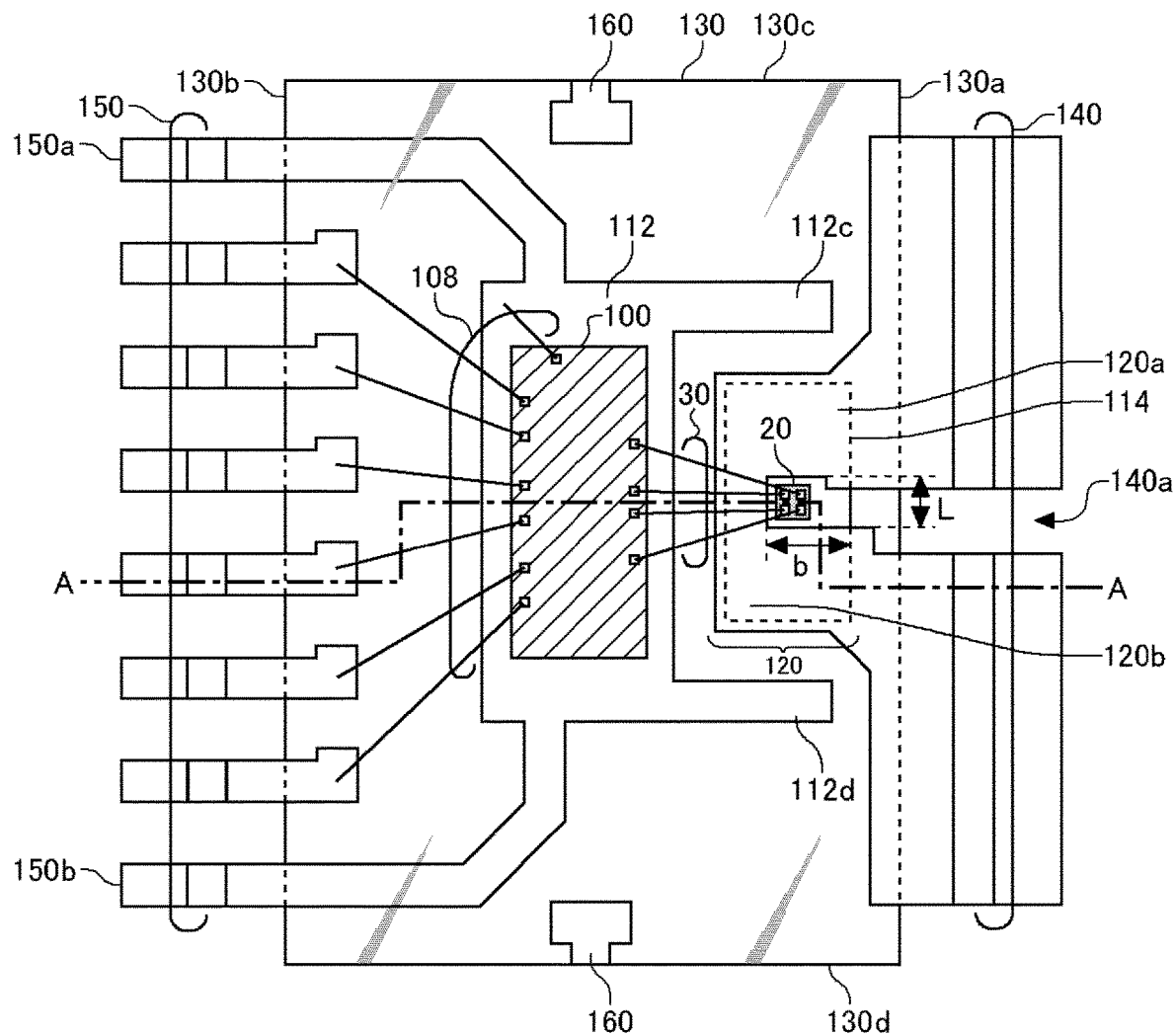
FIG. 1A is a schematic plan view seen from the top side of a current sensor according to a present embodiment.
Figure 1A:
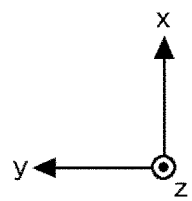

Hereinafter, embodiments of the present invention will be described, but the embodiments do not limit the invention according to the claims. In addition, not all of the combinations of features described in the embodiments are essential to the solution of the invention.

The current sensor includes a primary conductor through which a measurement current to be measured flows; a magnetoelectric conversion element that detects a magnetic field generated by the measurement current; and a signal processing IC that amplifies a signal of the magnetoelectric conversion element and outputs it to the outside. The current sensor is provided as one semiconductor package such that the primary conductor, the magnetoelectric conversion element, and the signal processing IC are encapsulated by a mold resin.

For example, Patent Document 1 discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a bottom surface of a supporting portion that supports the signal processing IC without being contact with the primary conductor.

In addition, Patent Document 2 also discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a back surface of the primary conductor.

In the current sensor according to Patent Document 1 and Patent Document 2, the insulating member supporting the magnetoelectric conversion element is comprised of an insulating tape or an insulating sheet. However, because the insulating member has a low stiffness, the insulating member may deform during being encapsulated by a resin in an assembly process. Deformation of the insulating member changes a position of the magnetoelectric conversion element provided at the opening of the primary conductor, causing a variation among individuals in a sensitivity of the measurement current to be measured by the magnetoelectric conversion element, which may deteriorate a quality of the current sensor.

In addition, an apparatus that produces an insulating member used for the current sensor described in Patent Document 1 and Patent Document 2 is not a general apparatus used for a general back-end process, but a dedicated apparatus. The dedicated apparatus is used to cut the insulating member into pieces with a desired size and attach it to a lead frame. Thus, manufacturing these current sensors needs an investment in the dedicated apparatus and makes the manufacturing process complicated, which results in a concern for the increase of a cost.

In view of this, each embodiment provides a small and highly sensitive current sensor with a high quality that can be brought by a reduction of a variation among individuals in a measurement sensitivity of a measurement current. In addition, each embodiment provides a small and highly sensitive current sensor that can achieve a cost reduction through a volume efficiency due to an efficient production.

Figure 1B:
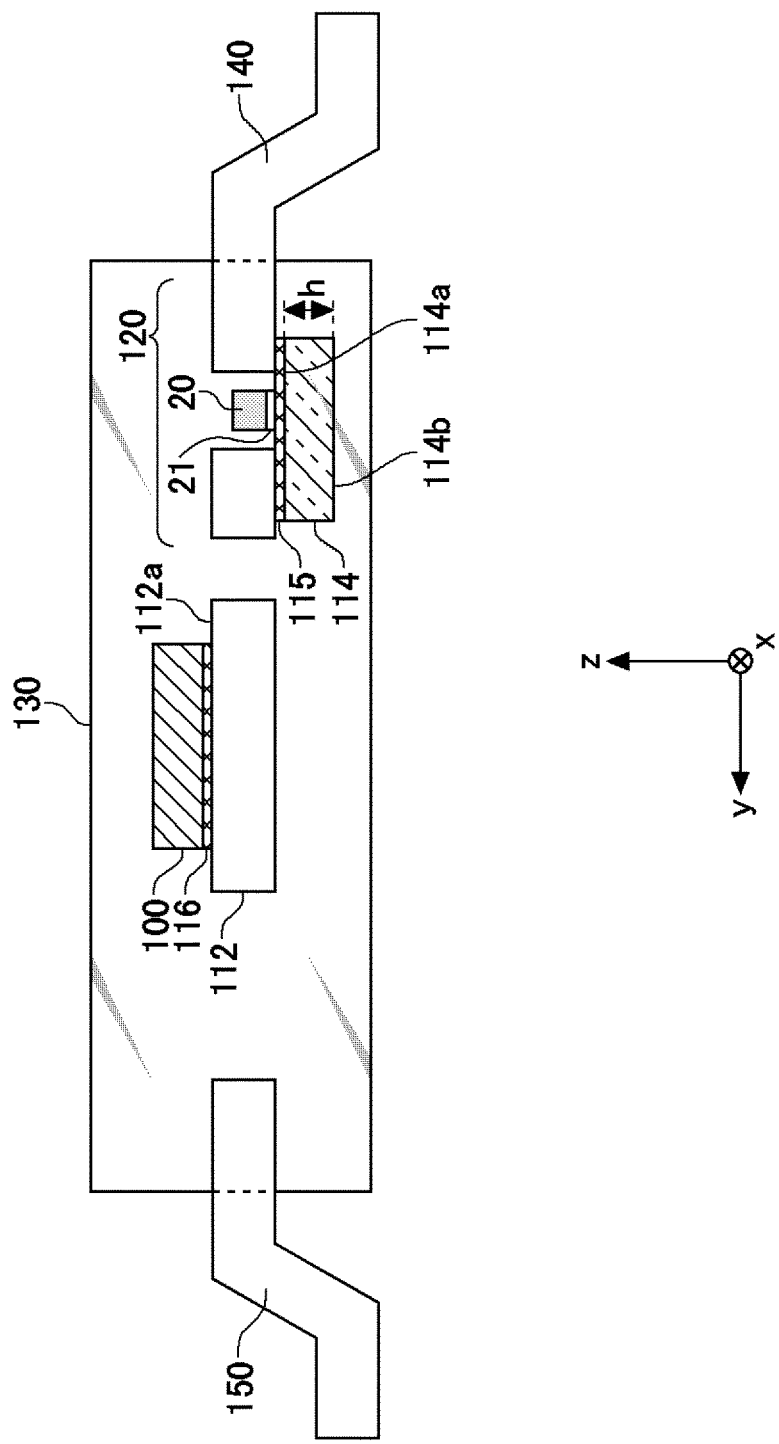
FIG. 1B is an A-A line sectional view of the current sensor illustrated in FIG. 1A.

FIG. 1A and FIG. 1B show the internal configuration of a semiconductor package that serves as a current sensor 10 according to an embodiment. FIG. 1A is a schematic plan view seen from the top side (in the Z axis direction) of the current sensor 10 according to an embodiment. FIG. 1B is an A-A line sectional view of the current sensor 10 shown in FIG. 1A.

For the coordinate, in FIG. 1A, the X axis direction is defined as a direction from bottom to top and parallel to the document, the Y axis direction is defined as a direction from right to left and parallel to the document, and the Z axis direction is defined as a direction from back to front and perpendicular to the document. Any one axis among the X axis, the Y axis and the Z axis is orthogonal to another axis.

The current sensor 10 includes a signal processing IC 100, a magnetoelectric conversion element 20, an IC supporting portion 112, an element supporting portion 114, a conductor 120, an encapsulating portion 130, a pair of lead terminals 140, a plurality of lead terminals 150, and suspending pins 160. The magnetoelectric conversion element 20 is electrically connected to the signal processing IC 100 via wires 30.

The signal processing IC 100 is electrically connected to the plurality of lead terminals 150 via wires 108. The wires 30 and the wires 108 may be formed of a conductor material, main components of which are Au, Ag, Cu, or Al.

The encapsulating portion 130 encapsulates the magnetoelectric conversion element 20, the conductor 120, the signal processing IC 100, the IC supporting portion 112, the element supporting portion 114, the wires 30, and the wires 108 by a mold resin. The mold resin may be, for example, comprised of an epoxy-based thermosetting resin added with silica and formed into a semiconductor package by a transfer molding. Because of forming into the semiconductor package, the current sensor 10 with a small size can be achieved.

The magnetoelectric conversion element 20 detects a magnetic field in a particular direction that changes in response to a measurement current flowing through the conductor 120, and then the signal processing IC 100 amplifies a signal that depends on an intensity of the magnetic field and outputs an amplified signal via the lead terminal 150. The magnetoelectric conversion element 20 may be a chip that is comprised of a compound semiconductor formed on a GaAs substrate and is cut into a square shape or a rectangular shape in the plan view in the Z axis direction. The magnetoelectric conversion element 20 may have a substrate comprised of silicon or compound semiconductor and a magnetoelectric conversion portion provided on the substrate. The thickness of the substrate is adjusted by grinding a surface on the negative side in the Z axis direction. The substrate may have a desired thickness in the range from 50 μm to 600 μm. Because the magnetic field in the Z axis direction is to be detected, a Hall element is appropriate as the depicted magnetoelectric conversion element. In addition, if the magnetoelectric conversion element 20 is arranged at a position for detecting a magnetic field in a direction of any one axis on the XY plane, for example, if it is arranged at a position for detecting a magnetic field in the X axis direction, a magneto-resistance element or a flux gate element is appropriate as the magnetoelectric conversion element.

In a present embodiment, an example is described where the current sensor 10 includes one magnetoelectric conversion element 20. However, the current sensor 10 may include two or more magnetoelectric conversion elements 20. In a plan view, at least a part of each of the plurality of magnetoelectric conversion elements 20 may be surrounded by the conductor 120. A part of the conductor 120 may be arranged between each of the plurality of magnetoelectric conversion elements 20.

The signal processing IC 100 processes a signal output from the magnetoelectric conversion element 20. The signal processing IC 100 is a large scale integration (LSI). The signal processing IC 100 is cut into a rectangular shape or a square shape in the plan view. The signal processing IC 100 may be a signal processing circuit comprised of a Si monolithic semiconductor formed on a Si substrate. It may be a compound semiconductor substrate instead of the Si substrate. The signal processing circuit processes an output signal that depends on an intensity of a magnetic field output from the magnetoelectric conversion element 20. The signal processing circuit outputs, via the lead terminal 150, a signal indicating a current value of a measurement current flowing through the conductor 120 based on the output signal. The thickness of the substrate of the signal processing IC 100 is adjusted by grinding a surface on the negative side of the Z axis direction. The substrate has a desired thickness in the range from 50 μm to 600 μm. The signal processing circuit of the signal processing IC 100 includes a circuit that inputs a small output signal depending on the intensity of the magnetic field from the magnetoelectric conversion element and at least amplifies the input signal.

The conductor 120 has a U-shape in the plan view, surrounds at least partially the magnetoelectric conversion element 20 in the plan view, and flows a measurement current to be measured by the magnetoelectric conversion element 20. The conductor 120 is electrically connected to the pair of lead terminals 140. The conductor 120 may be configured to be physically integrated with the pair of lead terminals 140. The measurement current is input to one of the pair of lead terminals 140 and is output from the other of the lead terminals 140 via the conductor 120. The pair of lead terminals 140 and the conductor 120 may be configured to be integrated with each other through a lead frame of a conductor material, a main component of which is copper. The measurement current to be measured by the magnetoelectric conversion element 20 flows through the pair of lead terminals 140 and the conductor 120. The conductor 120 has a slit 140a that makes an opening on the side of a side surface 130a of the encapsulating portion 130. The magnetoelectric conversion element 20 is arranged within the slit 140a. The measurement current flowing through the conductor 120 flows from one end of the U-shape to the other end. This generates, around the conductor 120, a magnetic field that depends on an intensity of the measurement current and a distance from the conductor 120. At a position where the magnetoelectric conversion element 20 is arranged, the magnetic field is generated where the Z axis direction component is highest. Because the magnetoelectric conversion element 20 is arranged within the slit 140a, a high sensitivity can be achieved for the measurement current.

The pair of lead terminals 140 and the plurality of lead terminals 150 are arranged such that they oppose to each other via the signal processing IC 100 in the direction (the Y axis direction) that intersects with the thickness direction (the Z axis direction) of the signal processing IC 100. The pair of lead terminals 140 is partially exposed on the side surface 130a of the encapsulating portion 130. The plurality of lead terminals 150 is partially exposed on a side surface 130b that is opposite to the side surface 130a of the encapsulating portion 130. The suspending pins 160 are partially exposed on a side surface 130c and a side surface 130d that oppose to each other in the X axis direction and are different from the side surface 130a and the side surface 130b of the encapsulating portion 130. The suspending pins 160 are metal members to support a semiconductor package on a lead frame in the manufacturing phase. The suspending pins 160 are leads to support the encapsulating portion 130 that is formed by a mold resin during an assembly process.

The plurality of lead terminals 150 is a metal member electrically connected to the signal processing IC 100, and the suspending pins 160 are metal members not electrically connected to the signal processing IC 100. The suspending pins 160 are separate from the plurality of lead terminals 150. The plurality of lead terminals 150 and the suspending pins 160 may be comprised of a lead frame of a conductor material, a main component of which is copper, which are the same as the pair of lead terminals 140 and the conductor 120. The plurality of lead terminals 150 and the suspending pins 160 are separate from the conductor 120 and are electrically insulated from the conductor 120.

The pair of lead terminals 140, the conductor 120, the plurality of lead terminals 150, the IC supporting portion 112, and the suspending pins 160 may be configured to be integrated with each other through a single lead frame of a conductor material, a main component of which is copper.

The pair of lead terminals 140 is a lead terminal on the primary side, and is an example of the pair of first lead terminals. The plurality of lead terminals 150 is a lead terminal on the secondary side, and is an example of the plurality of second lead terminals. The lead frame has a desired thickness in the range from 50 μm to 600 μm.

The IC supporting portion 112 is a plate-shaped member and supports the signal processing IC 100 on a surface 112a on the top side of the current sensor 10. The IC supporting portion 112 is a land on which the signal processing IC 100 is mounted. The IC supporting portion 112 may be configured to be integrated with at least one lead terminal among the plurality of lead terminals 150. In the present embodiment, the IC supporting portion 112 is configured to be integrated with a lead terminal 150a and a lead terminal 150b positioned on both ends in the X axis direction among the plurality of lead terminals 150. The IC supporting portion 112 may be comprised of a lead frame including the plurality of lead terminals 150. The signal processing IC 100 may be adhered to the surface 112a of the IC supporting portion 112 via an adhesive layer 116. The adhesive layer 116 may be an adhesive tape.

The IC supporting portion 112 has an extending portion 112c and an extending portion 112d that extend toward the pair of lead terminals 140 to surround the conductor 120. The conductor 120 and the magnetoelectric conversion element 20 are arranged between the extending portion 112c and the extending portion 112d.

However, the IC supporting portion 112 may only be on the side of the signal processing IC from the end portion of the conductor 120 on the side of the signal processing IC 100 in the Y axis direction in the plan view. That is, the IC supporting portion 112 may not have the extending portion 112c and the extending portion 112d which are arranged to surround the conductor 120. In this manner, a gap between the IC supporting portion 112 and the conductor 120 can be easily filled with a mold resin.

The element supporting portion 114 is comprised of a semiconductor substrate and supports the magnetoelectric conversion element 20 and the conductor 120 on a surface 114a on the same side as the surface 112a of the IC supporting portion 112. The element supporting portion 114 is adhered to the magnetoelectric conversion element 20 via an adhesive layer 21 and an adhesive layer 115 and is adhered to the conductor 120 via the adhesive layer 115. The element supporting portion 114 is adhered to a part of a surface on the negative side in the Z axis direction of the conductor 120 and is arranged to project to a position of the magnetoelectric conversion element 20. Because the element supporting portion 114 and the conductor 120 are in contact with each other, the conductor 120 does not have any step. The semiconductor substrate constituting the element supporting portion 114 may be a silicon substrate, or a compound semiconductor substrate. The thickness of the semiconductor substrate may be in the range from 100 μm to 700 μm. The semiconductor substrate may have an appropriate thickness enough to prevent cracking, though it depends on a size of the semiconductor substrate. The adhesive layer 21 and the adhesive layer 115 may be die-attach films.

The adhesive layer 21, the adhesive layer 115, and the adhesive layer 116 may have the same size as the magnetoelectric conversion element 20, the element supporting portion 114, and the signal processing IC 100 in the plan view. The adhesive layer 21, the adhesive layer 115, and the adhesive layer 116 may be die-attach films comprised of a non-conductive resin or die-attach films comprised of a conductive resin. The non-conductive resin may be an epoxy-based or silicone-based resin. The conductive resin may be an epoxy-based resin mixed with the filler of Ag. The adhesive layer 21, the adhesive layer 115, and the adhesive layer 116 have a desired thickness in the range from 1 μm to 50 μm. The adhesive layer 21, the adhesive layer 115, and the adhesive layer 116 may be a paste configured as conductive or non-conductive.

The conductor 120 has a first portion 120a and a second portion 120b that are spaced apart in the X axis direction. That is, the conductor 120 has the first portion 120a and the second portion 120b that are spaced apart in the plan view. The magnetoelectric conversion element 20 is arranged between the first portion 120a and the second portion 120b. The element supporting portion 114 supports the first portion 120a and the second portion 120b on both end parts in the X axis direction. The distance in the X axis direction, which is the longitudinal direction, of a portion that does not support the first portion 120a and the second portion 120b between both end parts of the element supporting portion 114 is defined as L (m), the distance in the Y axis direction, which is the transverse direction, of the portion that does not support the conductor 120 of the element supporting portion 114 is defined as b (m), and the thickness of the element supporting portion 114 is defined as h (m). When a load P (N) is applied, in the negative direction of the Z axis direction, to a position at which the magnetoelectric conversion element 20 of the element supporting portion 114 is arranged, as in a three-point bending test, a stress σ (Pa) occurred at the element supporting portion 114 is represented as the following expression (1).

$$\sigma = (2/3) \times (PL/bh^2) \quad (1)$$

Herein, it is known from an experiment that, when the element supporting portion 114 is a silicon substrate, a breaking stress $\sigma_b$ of the silicon substrate is about 400 MPa. For example, if the stress σ which is occurred in the silicon substrate when die bonding a Hall element to the silicon substrate with 100gf (which is approximately equal to 100× $10^{-4}$ N) is in the range lower than the breaking stress, an assembly can be performed without cracking the silicon substrate. Herein, assuming that the width b of the silicon substrate in the transverse direction is 0.3 mm, which is equivalent to the smallest width of the Hall element, the relational expression (2) is obtained between L and h.

$$\sigma = (2/3) \times ((100 \times 10^{-4}) \times L/(0.3 \times 10^{-3}) \times h^2) < (400 \times 10^6)$$
$$= \sigma_b$$

$$\text{Hence, } L < 8 \times 10^6 \times h^2 \quad (2)$$

As long as L and h meet the relational expression (2), a stable assembly can be performed with reducing the displacement of the Hall element.

In other words, it is preferable to meet $L < 8 \times 10^6 \times h^2$, when defining the distance in the X axis direction, which is the longitudinal direction, of the portion that does not support the first portion 120a and the second portion 120b between both end parts of the element supporting portion 114 as L and the thickness of the element supporting portion 114 as h.

Herein, it is also known from an experiment that, when the element supporting portion 114 is a GaAs substrate, a breaking stress $\sigma_b$ of the GaAs substrate is about 100 MPa. Therefore, because the relational expression (A) is obtained between L and h by replacing the above-described (400× $10^6$) with (100× $10^6$), it is more preferable that $L < 2 \times 10^6 \times h^2$ is met.

$$L < 2 \times 10^6 \times h^2 \quad (A)$$

On the other hand, the distance L in the X axis direction, which is the longitudinal direction, of a portion that does not support the first portion 120a and the second portion 120b between both end parts of the element supporting portion 114 must be greater than the minimum width of a blanked part of a lead frame. Therefore, because the minimum width of the blanked part of the lead frame is approximately the same as the thickness $t_{LF}$ of the lead frame, the relational expression (B) is obtained between L and $t_{LF}$.

$$t_{LF} < L \quad (B)$$

Because, for the current sensor according to the present embodiment, the element supporting member supporting the magnetoelectric conversion element 20 is comprised of a semiconductor substrate with a stiffness, a deformation of the element supporting member can be prevented so that a position of the magnetoelectric conversion element 20 is stabilized. This can reduce a variation among individuals in a sensitivity of a measurement current measured by the magnetoelectric conversion element 20 and can improve a quality of the current sensor 10.

Figure 2:
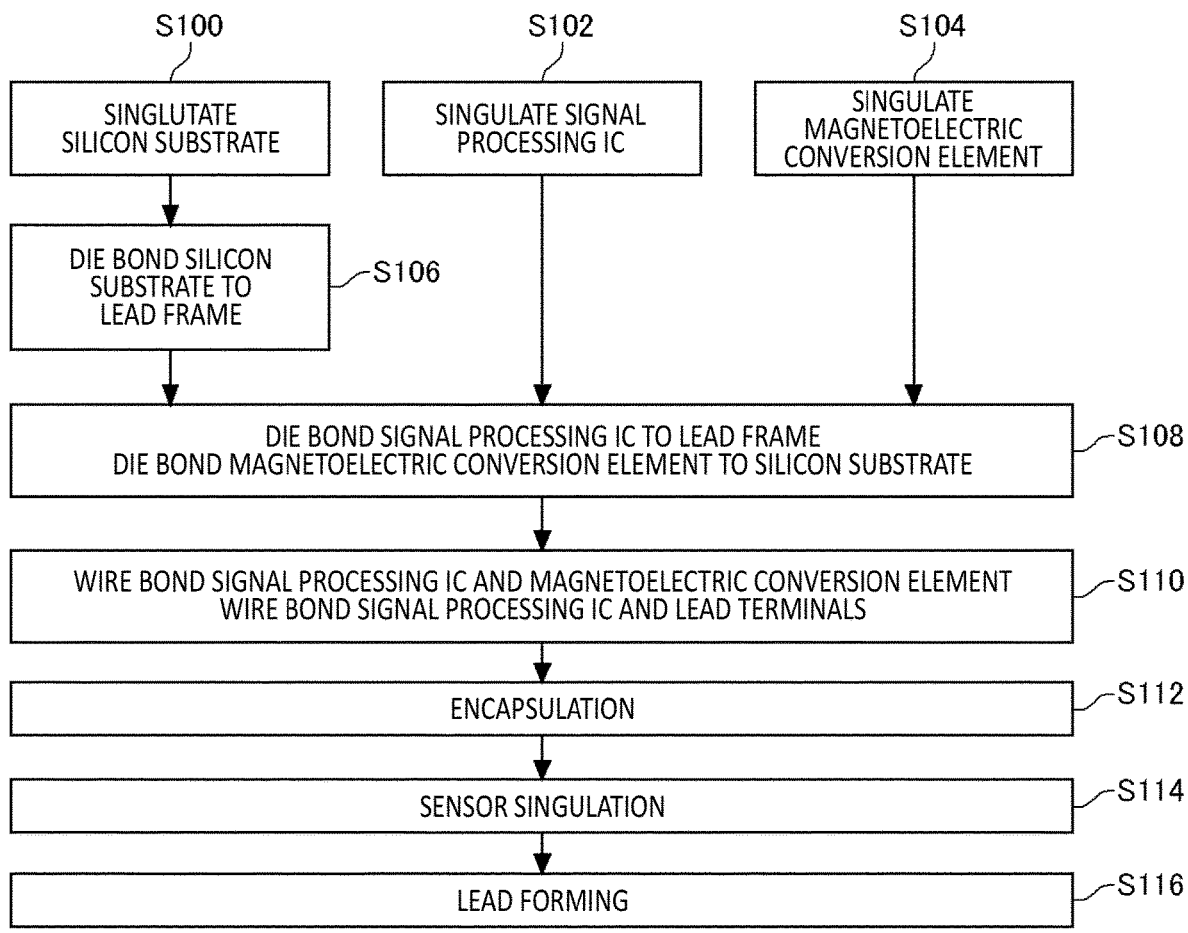
FIG. 2 is a flowchart showing a procedure of a manufacturing method of the current sensor according to the present embodiment.

FIG. 2 is a flowchart showing a procedure of a manufacturing method of the current sensor 10 according to the present embodiment. FIG. 3A, FIG. 3B, FIG. 3C, and FIG. 3D are schematic diagrams showing the manufacturing process of the current sensor 10 according to the present embodiment.

First, a semiconductor wafer is diced to singulate a silicon substrate to be used as the element supporting portion 114 (S100). The silicon substrate to be used as the element supporting portion 114 may be made by grinding a silicon wafer to a desired thickness with a back grind apparatus used in a back-end process, and then cutting it into a desired size with a dicing apparatus used in the back-end process. If a die-attach film is used for a dicing tape in a dicing, the element supporting portion 114 and the die-attach film as the adhesive layer 115 are simultaneously formed.

Furthermore, a wafer of the signal processing IC 100 is diced to singulate the signal processing IC 100 (S102). In addition, a wafer of the magnetoelectric conversion element 20 is diced to singulate the magnetoelectric conversion element 20 (S104). In a singulation process of the signal processing IC 100, the signal processing IC 100 is made by grinding the wafer of the signal processing IC 100 to a desired thickness with a back grind apparatus, and then cutting it into a desired size with a dicing apparatus. If a die-attach film is used for a dicing tape in a dicing, the signal processing IC 100 and the die-attach film as the adhesive layer 116 are simultaneously formed. In addition, in a singulation process of the magnetoelectric conversion element 20, the magnetoelectric conversion element 20 is made by grinding the wafer of the magnetoelectric conversion element 20 to a desired thickness with a back grind apparatus, and then cutting it into a desired size with a dicing apparatus. If a die-attach film is used for a dicing tape in a dicing, the magnetoelectric conversion element 20 and the die-attach film as the adhesive layer 21 are simultaneously formed.

Figure 3A:
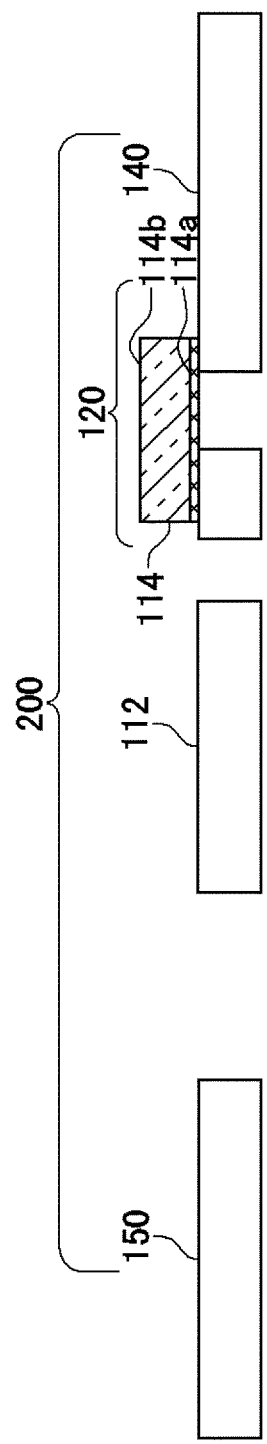
FIG. 3A is a schematic diagram showing the manufacturing process of the current sensor according to the present embodiment.

As shown in FIG. 3A, a lead frame 200 including the conductor 120, the IC supporting portion 112, the lead terminals 140, the lead terminals 150, and the suspending pins 160 is formed to be flat without being provided with any step in the portion of the conductor 120. Herein, in the lead frame 200, the surface 114a of the element supporting portion 114 that supports the conductor 120 is defined as a first surface, and a surface that is opposite to the first surface is defined as a second surface 114b. The silicon substrate that is the element supporting portion 114 is adhered via the adhesive layer 115 through a die bonding on a part of the surface of the conductor 120 that is on the same side as the second surface of the lead frame 200 (S106). After the die bonding, it is desirable to cure the adhesive layer 115 to firmly bond it to the conductor 120.

Figure 3B:
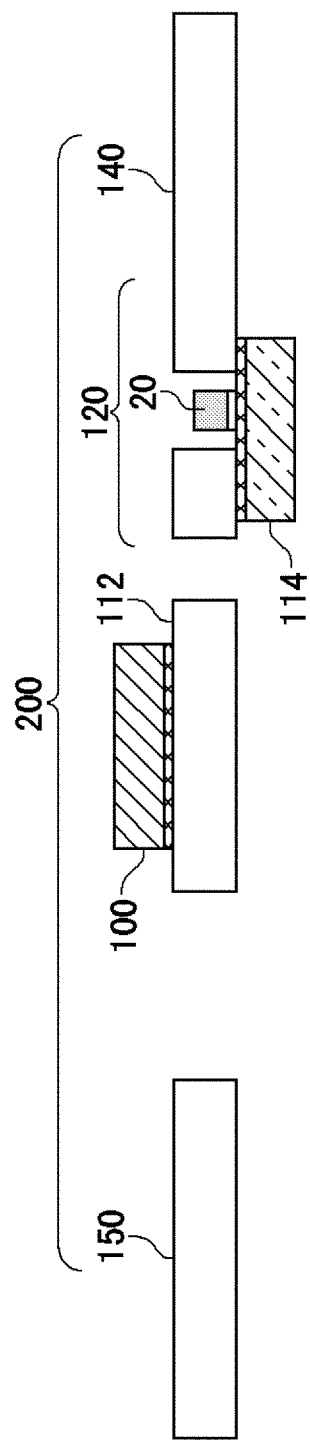
FIG. 3B is a schematic diagram showing the manufacturing process of the current sensor according to the present embodiment.

Then, as shown in FIG. 3B, the signal processing IC 100 is adhered via the adhesive layer 116 through a die bonding on a part of the surface of the IC supporting portion 112 that is on the same side as the first surface of the lead frame 200, and the magnetoelectric conversion element 20 is adhered via the adhesive layer 21 through a die bonding on the first surface of the element supporting portion 114 of the lead frame 200, such that the magnetoelectric conversion element 20 is at least partially surrounded by the conductor 120 in the plan view (S108). After the die bonding, it is desirable to cure the adhesive layer 116 of the signal processing IC 100 to firmly bond it to the IC supporting portion 112. In addition, after the die bonding, it is desirable to cure the adhesive layer 21 of the magnetoelectric conversion element 20 to firmly bond it to the element supporting portion 114.

Furthermore, the signal processing IC 100 and the magnetoelectric conversion element 20 are electrically connected together through a wire bonding, and furthermore the signal processing IC 100 and the lead terminals 150 on the secondary side are electrically connected through a wire bonding (S110).

Figure 3C:
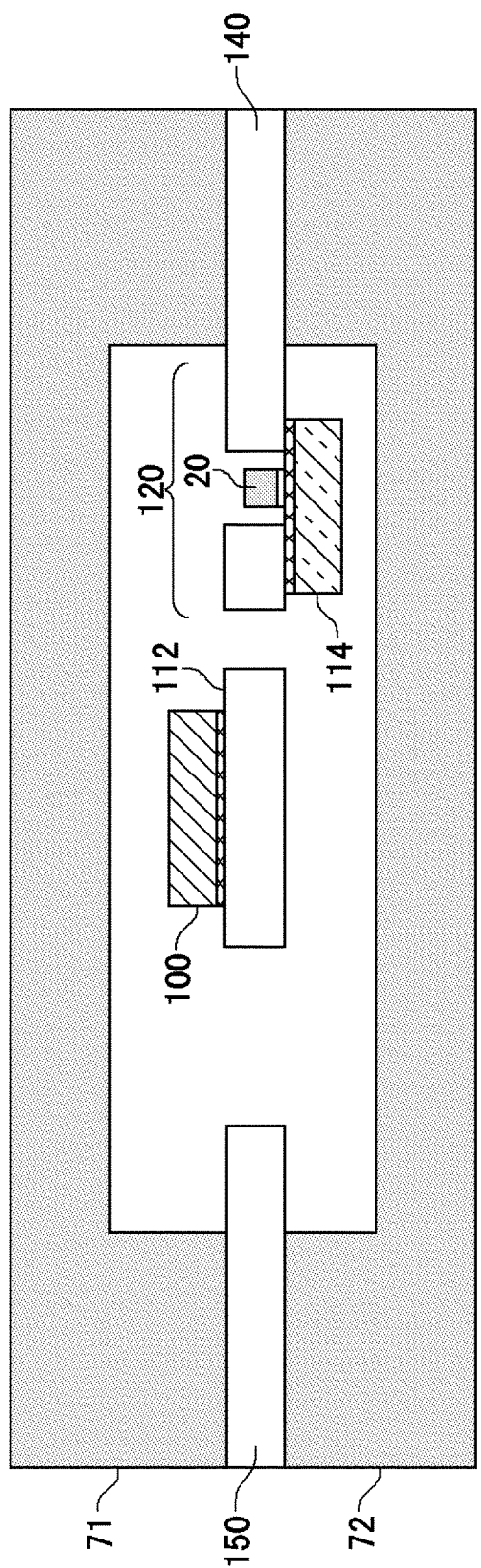
FIG. 3C is a schematic diagram showing the manufacturing process of the current sensor according to the present embodiment.

As shown in FIG. 3C, in an encapsulation process, the encapsulating portion 130 is formed by encapsulating the lead frame 200 including the IC supporting portion 112, the lead terminals 140, the lead terminals 150, and the suspending pins 160, the magnetoelectric conversion element 20, the element supporting portion 114, and the signal processing IC 100 with a mold resin (S112). In addition, in the encapsulation process, the lead frame 200 on which the element supporting portion 114, the magnetoelectric conversion element 20, and the signal processing IC 100 are assembled and electrically connected through the wires 30 and the wires 108 is inserted between a mold tool 71 and a mold tool 72 and is molded with a poured mold resin. After the encapsulation, it is desirable to cure the mold resin to be hardened sufficiently.

Figure 3D:
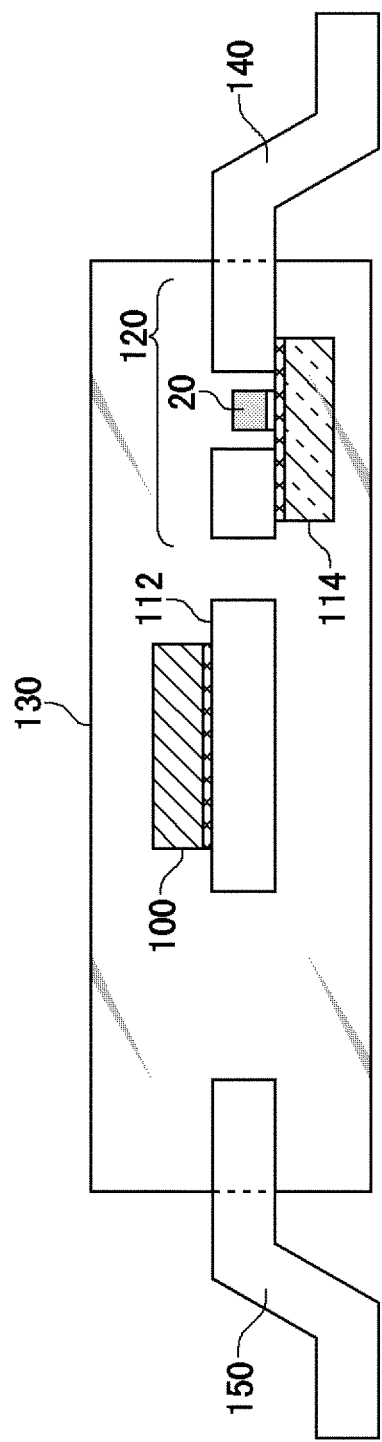
FIG. 3D is a schematic diagram showing the manufacturing process of the current sensor according to the present embodiment.

As shown in FIG. 3D, the current sensor that is encapsulated is singulated (S114), and a lead forming is performed to cut the lead terminals 140 and the lead terminals 150 into a desired length and form them into a desired shape (S116). Thus, the current sensor 10 according to the present embodiment is completed.

As described above, because in the manufacturing method of the current sensor 10, everything can be handled with apparatuses of a back-end process, no investment on dedicated apparatuses is needed, resulting in an efficient production of the current sensor 10, reducing a cost through a volume efficiency.

Figure 4:
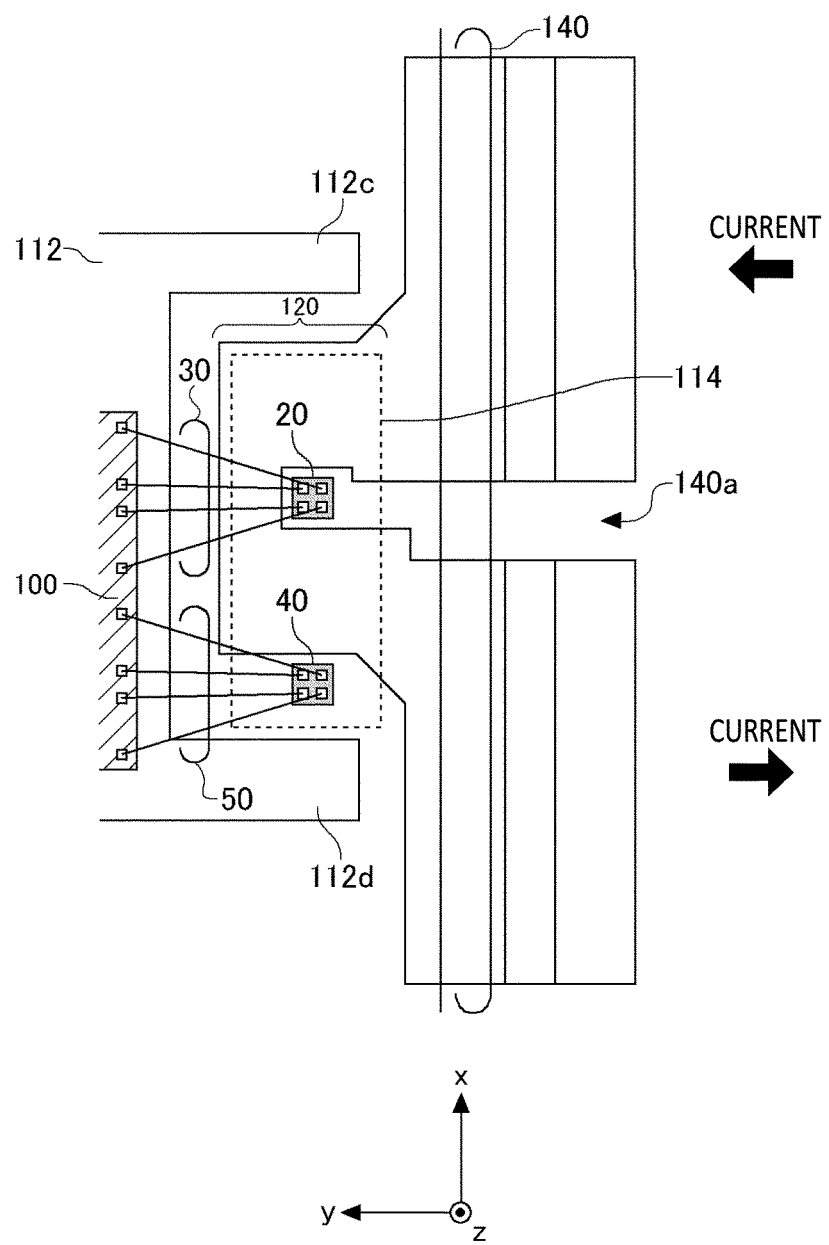
FIG. 4 is a schematic plan view seen from the top side around a conductor of the current sensor according to a variation of the present embodiment.

FIG. 4 is a variation of the present embodiment and shows the internal configuration of the semiconductor package that serves as the current sensor 10, in which only the surroundings of the conductor 120 is shown. FIG. 4 is a schematic plan view seen from the top side (in the Z axis direction) of the current sensor 10 according to a variation of the present embodiment.

As shown in FIG. 4, the current sensor 10 that is the variation of the present embodiment is formed such that two magnetoelectric conversion elements 20 and 40 are arranged near the conductor 120. The magnetoelectric conversion elements 20 and 40 are electrically connected to the signal processing IC 100 via the wires 30 and wires 50, respectively. The magnetoelectric conversion element 20 is in the slit 140a and is arranged on the surface 114a on the top side of the element supporting portion 114. In addition, the magnetoelectric conversion element 40 is positioned to be opposed to the magnetoelectric conversion element 20 in the X axis direction across the conductor 120 and is arranged on the surface 114a on the top side of the element supporting portion 114.

Thus, when a measurement current flowing through the conductor 120 is supplied in the direction of the depicted arrow, a magnetic field is generated in the positive direction of the Z axis direction at the position of the magnetoelectric conversion element 20, and a magnetic field is generated in the negative direction of the Z axis direction at the position of the magnetoelectric conversion element 40. For output voltages of the magnetoelectric conversion elements 20 and 40, the positive and negative voltage, or the negative and positive voltage is obtained. Therefore, a signal processing circuit calculates the difference in the output voltages between the magnetoelectric conversion elements 20 and 40 to obtain a signal depending on an intensity of current. On the other hand, because the same positive voltage or the same negative voltage is obtained for output voltages of the magnetoelectric conversion elements 20 and 40, an external magnetic field, for example, terrestrial magnetism is canceled out by calculating the difference. The current sensor 10 can achieve a higher sensitivity to a measurement current and a higher resistance to an external noise.

While the present invention has been described by way of the embodiments, the technical scope of the present invention is not limited to the above described embodiments. It is apparent to persons skilled in the art that various alterations or improvements can be made to the above described embodiments. It is also apparent from the description of the claims that the embodiments to which such alterations or improvements are made can be included in the technical scope of the present invention.

The operations, procedures, steps, stages, etc. of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

[Item 1] A current sensor comprising:
  at least one magnetoelectric conversion element;
  a conductor that at least partially surrounds the at least one magnetoelectric conversion element in a plan view and through which a measurement current to be measured by the at least one magnetoelectric conversion element flows;
  an element supporting portion that is comprised of a semiconductor substrate, and supports the at least one magnetoelectric conversion element and the conductor on a first surface;
  a signal processing IC that processes a signal that is output from the at least one magnetoelectric conversion element;
  an encapsulating portion that encapsulates the at least one magnetoelectric conversion element, the conductor, and the signal processing IC; and
  a pair of first lead terminals that is partially exposed on a side surface of the encapsulating portion, is electrically connected to the conductor, inputs the measurement current to the conductor and outputs the measurement current from the conductor.

[Item 2] A current sensor according to item 1, further comprising:
  a plurality of second lead terminals that is partially exposed on a side surface of the encapsulating portion and is electrically connected to the signal processing IC; and
  an IC supporting portion that is configured to be integrated with at least one second lead terminal among the plurality of second lead terminals and supports the signal processing IC on a surface of a same side as the first surface.

[Item 3] The current sensor according to item 2, wherein the pair of first lead terminals and the plurality of second lead terminals are arranged to be opposite to each other via the signal processing IC in a first direction,
  the conductor has a first portion and a second portion that are spaced apart from each other in a plan view, in a second direction intersecting the first direction,
  the at least one magnetoelectric conversion element is arranged between the first portion and the second portion,
  the element supporting portion supports the first portion and the second portion on both end parts in the second direction, and
  when a distance in the second direction of a portion between said both end parts of the element supporting portion that does not support the first portion and the second portion is defined as L, and a thickness of the element supporting portion is defined as h, $L < 8 \times 10^6 \times h^2$ is met.

[Item 4] The current sensor according to item 3, wherein a thickness of the element supporting portion is in a range from 0.1 mm to 0.7 mm.

[Item 5] The current sensor according to any one of items 2 to 4, further comprising an adhesive layer that adheres the conductor to the first surface of the element supporting portion.

[Item 6] The current sensor according to item 5, wherein the adhesive layer is a die-attach film.

[Item 7] The current sensor according to any one of items 1 to 4, wherein the semiconductor substrate is a silicon substrate.

EXPLANATION OF REFERENCES

10: current sensor;
20, 40: magnetoelectric conversion element;
30, 50, 108: wire;
100: signal processing IC;
112: IC supporting portion;
114: element supporting portion;
115, 116: adhesive layer;
120: conductor;
130: encapsulating portion;
140, 150: lead terminal;
160: suspending pin;
200: lead frame.

What is claimed is:
1. A current sensor comprising:
at least one magnetoelectric conversion element;
a conductor that at least partially surrounds the at least one magnetoelectric conversion element in a plan view and through which a measurement current to be measured by the at least one magnetoelectric conversion element flows;

an element supporting portion that is comprised of a semiconductor substrate, and supports the at least one magnetoelectric conversion element and the conductor on a first surface;

a signal processing IC that processes a signal that is output from the at least one magnetoelectric conversion element;

an encapsulating portion that encapsulates the at least one magnetoelectric conversion element, the conductor, and the signal processing IC;

a pair of first lead terminals that is partially exposed on a side surface of the encapsulating portion, is electrically connected to the conductor, inputs the measurement current to the conductor and outputs the measurement current from the conductor;

a plurality of second lead terminals that is partially exposed on a side surface of the encapsulating portion and is electrically connected to the signal processing IC; and an IC supporting portion that is configured to be integrated with at least one second lead terminal among the plurality of second lead terminals and supports the signal processing IC on a surface of a same side as the first surface;

wherein the pair of first lead terminals and the plurality of second lead terminals are arranged to be opposite to each other via the signal processing IC in a first direction, the conductor has a first portion and a second portion that are spaced apart from each other in a plan view, in a second direction intersecting the first direction, the at least one magnetoelectric conversion element is arranged between the first portion and the second portion, the element supporting portion supports the first portion and the second portion on both end parts in the second direction, and when a distance in the second direction of a portion between said both end parts of the element supporting portion that does not support the first portion and the second portion is defined as L, and a thickness of the element supporting portion is defined as h, $$L < 8 \times 10^6 \times h^2 \text{ is met.}$$

2. The current sensor according to claim 1, wherein a thickness of the element supporting portion is in a range from 0.1 mm to 0.7 mm.

3. The current sensor according to claim 1, further comprising an adhesive layer that adheres the conductor to the first surface of the element supporting portion.

4. The current sensor according to claim 3, wherein the adhesive layer is a die-attach film.

5. The current sensor according to claim 1, wherein the semiconductor substrate is a silicon substrate.

* * * * *